(12) United States Patent
Li

(10) Patent No.: US 7,986,554 B2
(45) Date of Patent: Jul. 26, 2011

(54) DIFFERENT COMBINATIONS OF WORDLINE ORDER AND LOOK-AHEAD READ TO IMPROVE NON-VOLATILE MEMORY PERFORMANCE

(75) Inventor: Yan Li, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 227 days.

(21) Appl. No.: 12/051,492

(22) Filed: Mar. 19, 2008

(65) Prior Publication Data

US 2009/0237999 A1    Sep. 24, 2009

(51) Int. Cl.
    *G11C 11/34*    (2006.01)
(52) U.S. Cl. ......... 365/185.03; 365/185.11; 365/185.12; 365/185.22
(58) Field of Classification Search ............. 365/185.03, 365/185.11, 185.12, 185.17, 185.18, 185.22, 365/185.29, 185.33
    See application file for complete search history.

(56) References Cited

U.S. PATENT DOCUMENTS

| | | | |
|---|---|---|---|
| 6,871,257 B2 * | 3/2005 | Conley et al. | 365/185.11 |
| 7,120,051 B2 * | 10/2006 | Gorobets et al. | 365/185.03 |
| 7,173,859 B2 * | 2/2007 | Hemink | 365/185.03 |
| 7,301,805 B2 * | 11/2007 | Gorobets et al. | 365/185.03 |
| 7,535,766 B2 * | 5/2009 | Ito | 365/185.22 |
| 2006/0221696 A1 | 10/2006 | Li | |
| 2006/0221704 A1 | 10/2006 | Li et al. | |
| 2006/0233010 A1 | 10/2006 | Li | |
| 2006/0233021 A1 | 10/2006 | Lin et al. | |
| 2006/0233023 A1 | 10/2006 | Lin et al. | |
| 2006/0239080 A1 | 10/2006 | Li | |
| 2007/0002626 A1 | 1/2007 | Li | |
| 2007/0109867 A1 | 5/2007 | Li | |

* cited by examiner

*Primary Examiner* — Trong Phan
(74) *Attorney, Agent, or Firm* — Davis Wright Tremaine LLP

(57) ABSTRACT

For a non-volatile memory storing three or more bits per cell, pages of data are written in an order where more than one, but less than all of the logical pages that a physical page along a wordline can store are written concurrently. More than one, but less than all of the logical pages that a physical page along a wordline can store are then written concurrently on an adjacent wordline. The process then comes back to the first wordline and writes at least one more logical page. A process is also described where one or more logical pages are written into a physical page along a wordline, after which one or more logical pages are written into a physical page along an adjacent wordline. A read operation is then performed on the first wordline and the resultant read is corrected based on the result of programming the adjacent wordline. This corrected read is then used in writing at least one more logical page in a second programming operation on the first wordline.

14 Claims, 4 Drawing Sheets

DIFFERENT COMBINATIONS OF WORDLINE ORDER AND LOOK-AHEAD READ TO IMPROVE NON-VOLATILE MEMORY PERFORMANCE

FIELD OF THE INVENTION

This invention relates generally to non-volatile semiconductor memory such as electrically erasable programmable read-only memory (EEPROM) and flash EEPROM, and specifically to variations in the order in which pages of data are programmed onto wordlines and the use of look ahead read processes.

BACKGROUND OF THE INVENTION

In the design of non-volatile memories, such as flash memory, there is a continuing process of improving these memories by increasing their storage density, increasing their performance, and reduce power consumption. Improvements in one of these requirements will often negatively affect one of the others. For example, to improve storage density, flash memory with multiple levels per cell can be used to replace the binary chips; however, the speed of operations can be slower in multi-state memories, such as in the case of writing data where the tolerances between states become stricter. Consequently, the performance level of memories having multi-level cells has much scope for improvement.

These and related problems, along with additional background information, is given in the Background section of US patent application publication numbers US-2006-0221704-A1 (now U.S. Pat. No. 7,206,230) and US-2007-0109867-A1 (now U.S. Pat. No. 7,577,037). The following US patent application publication numbers also provide additional background information: US 2006-0233023-A1 (now U.S. Pat. No. 7,619,922); US 2006-0233021-A1 (now U.S. Pat. No. 7,609,552); US 2006-0221696-A1 (now U.S. Pat. No. 7,447,078); US 2006-0233010-A1 (now U.S. Pat. No. 7,480,181); US 2006-0239080-A1 (now U.S. Pat. No. 7,463,521); and US 2007-0002626-A1 (now U.S. Pat. No. 7,486,558). As noted below, all of these are fully incorporated herein by reference.

Therefore there is a general need for high performance and high capacity non-volatile memory. In particular, there is a need for a compact non-volatile memory with enhanced read and program performance having an improved processor that is compact and efficient, yet highly versatile for processing data among the read/writing circuits.

SUMMARY OF INVENTION

In a first set of aspects, for a non-volatile memory storing 3 or more bits per cell, pages of data are written in an order where more than one, but less than all of the logical pages that a physical page along a wordline can store are written concurrently. More than one, but less than all of the logical pages that a physical page along a wordline can store are then written concurrently on an adjacent wordline. The process then comes back to the first wordline and writes at least one more logical page.

In a second set of aspect, for a non-volatile memory storing multiple bits per cell, one or more logical pages are written into a physical page along a wordline, after which one or more logical pages are written into a physical page along an adjacent wordline. A read operation is then performed on the first wordline and the resultant read is corrected based on the result of programming the adjacent wordline. This corrected read is then used in writing at least one more logical page in a second programming operation on the first wordline.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION OF THE PREFERRED EMBODIMENTS

Figure 1:
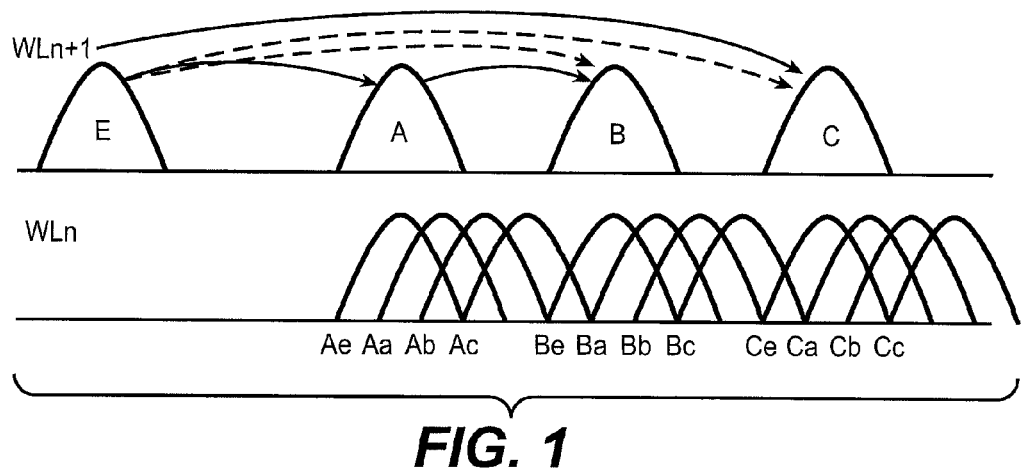
FIG. 1 illustrates the look ahead read process for the 2-bit example.

As non-volatile memories, such as NAND flash memory, with multi levels per cell are used to replace the binary chips, there is a generally agreed need for performance to improve. One set of performance enhancements is based on utilizing complicated cache algorithm to do parallel operations at the same time. Examples of some such enhancements are given US patent application publication numbers US-2006-0221704-A1 (now U.S. Pat. No. 7,206,230) and US-2007-0109867-A1 (now U.S. Pat. No. 7,577,037). Reference is also made to the following US patent application publication numbers, which provide additional detail on many aspects: US 2006-0233023-A1 (now U.S. Pat. No. 7,619,922); US 2006-0233021-A1 (now U.S. Pat. No. 7,609,552); US 2006-0221696-A1 (now U.S. Pat. No. 7,447,078); US 2006-0233010-A1 (now U.S. Pat. No. 7,480,181); US 2006-0239080-A1 (now U.S. Pat. No. 7,463,521); and US 2007-0002626-A1 (now U.S. Pat. No. 7,486,558). All of these references, along with references cited therein, are fully incorporated herein by reference, as noted above. Some of the techniques are described below to provide context for the subsequent development, but reference is again made to these prior applications for further detail. In this regard, the following can to some degree be considered a further development of what is described there.

In the aforementioned patent documents, particular reference is made to the sections describing the order in which data pages are programmed on to wordline and, more particularly, the use of "lower middle" ("LM") coding. Reference is also made to the "look ahead" ("LA") read process. Although much of that previous discuss was given primarily for 2-bit per cell embodiments, much the discussion here is related to aspects which are most pertinent for cases of 3 or more bits per cell.

The order in which the lower middle wordline program order can reduce the wordline to wordline capacitive coupling (or "Yupin effects") during program, but the program performance is relatively slow as more and more pages are stored on a wordline (or, equivalently, more bits per cell). The Look Ahead read can correct wordline to wordline coupling by doing corrective reading, improving program performance but at the sacrifice of read performance. The improvements given in the following combine these two different algorithms to help optimize performance in both read and program. Previously, these two algorithms have been employed separately.

For example, in the case of a chip where 3 bits (=8 states) are stored per cell, the Look Ahead (LA) read time is long: If the wordline to wordline (WL to WL) coupling effect needs to be corrected by LA read, then 8×8=64 reads are need, where 7 reads are for WL n+1 and the WLn corrective read will be 7*8=56. The read time is, in relative terms, very long. For a flash memory where 4 bits information is stored per cell, the LA read will take 16*16=256 times read. The sort of wordline order used in the lower middle (LM) program process, where the pages are jumping between wordlines are beneficial in correction the WL-WL Yupin coupling effects as the write proceeds. This will reduce the reliance on Look Ahead read for correcting WL to WL Yupin coupling. The principle aspects described below describe certain wordline orders and combinations LA read with wordline orders, with 3 and 4 bit per cell flash memory as the exemplary embodiments. Before moving on to the combining of these, some individual review of the Look Ahead read process and the 2 bit Lower Middle program process.

Look Ahead Read: Wordline Program Order

As more and more bits are stored per physical cells, the distribution of threshold values gets narrower. As the writing of data becomes correspondingly more delicate, the program will be much slower as it will use smaller step size. One of the distribution widening factors is WL-WL coupling effects.

One technique for handling some of these difficulties is the Look Ahead Read, which reads the next page information and then comes back to the current page to do corrective reading according to the data on the next page. For example, the 2 bits per cell memory is illustrated with respect to FIG. 1.

The upper portion of FIG. 1 shows wordline WLn+1 programmed from erase (E) to the states A, B, C states. Since they have 3 different Vth movements, then flash cells in wordline WLn will also have their Vth shifted for 3 different amounts (Ae, As, Ab, Ac; Be, Ba, Bb, Bc; Ce, Ca, Cb, Cc) for each state (lower case a, b, c) as shown in the lower line of FIG. 1. When reading the WLn states, each state will perform 4 reads to do a corrective reading: 1) read without correction; 2) read with WLn+1 program to A state correction; 3) read with WLn+1 program to B state correction; 3) read with WLn+1 program to C state correction. The total read will be 4×4=16 times that of a single read. (As wordline WLn+1 will have already been programmed prior to WLn, its effects will have been incorporated into the programming of the WLn.) Although not shown in FIG. 1, shifts to the erased (or ground) state distribution may also be taken into account; for example, in the 3 bit per cell case, the E distribution may be corrected before erase and the A state.

Figure 2:
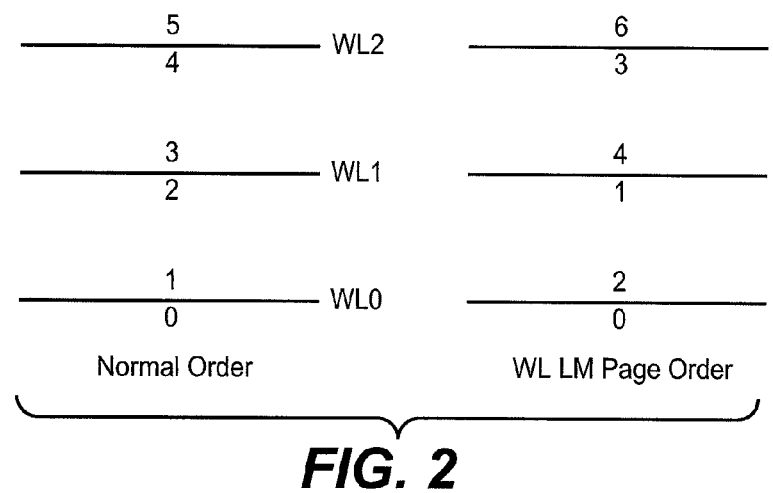
FIG. 2 illustrates normal order and lower middle page order in the programming of 2 bit memory cells.

Another technique for handling some of these difficulties is through the wordline order in the programming of pages. The pages can be arranged so that upper page information can be programmed while the lower page WL-WL capacitive (or Yupin) coupling is eliminated. FIG. 2 illustrates this for the case of 2 bits per cell.

The left side of FIG. 2 shows the normal page order, where all the pages in one wordline are finished program before moving on to the next wordline. Thus page 0 is programmed on WL0, after which page 1 is also programmed there. Similarly, page 2 and then page 3 are programmed on WL1, and on through the rest of the data set (pages 4, 5, 6, . . . ).

The right side of FIG. 2 illustrates the lower middle (LM) page order (pages 0, 1, 2, 3, 4, 6 are shown on WL0, WL1, WL2). The WL LM page order will program the lower page on WLn first and then go on to program the lower page on WLn+1. Then the upper page on WLn will be programmed after the WLn+1 lower page has finished programming. The advantage of this page order is that the upper page program is the only movement coupling to the previous wordline. The Yupin coupling effects incurred by the lower page Vt movement will have been corrected by the upper page program.

3 Bits per Cell Embodiments

Figure 3:
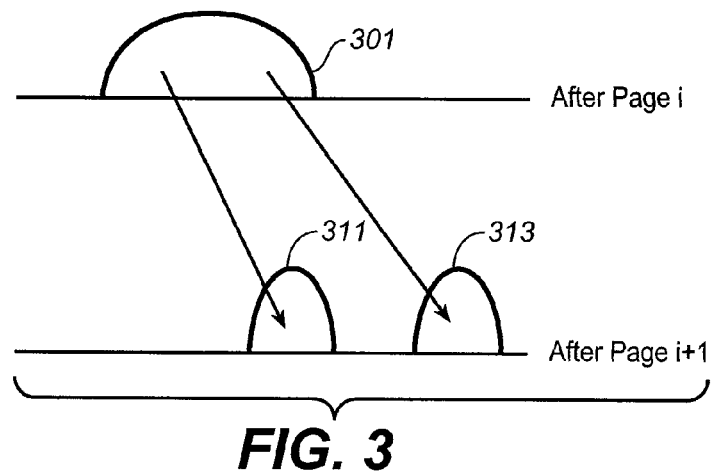
FIG. 3 shows how distributions are separated in the lower middle programming process.

For embodiments with 3 bits per cell, there are 3 pages on each wordline. (Or, more accurately, there are 3 logical pages that can be stored on each physical page along a wordline, where a physical page is the cells along a wordline in which a (write) page can be programmed concurrently. As each cell in the page can store 3 bits, a physical page can store 3 logical pages.) There are many possible combinations of page assignment. The LM code assignment is can be used to reduce bitline to bitline (BL-BL) capacitive, or Yupin, coupling. A characteristic of LM code is that the future states are derived from the previous states with minimum Vth movements, as is described more fully in the patent documents cited above. FIG. 3 shows illustrates a little of how the lower middle code works. Starting from an erase condition, the first page is programmed in, separating the erased page into those cell than remain erased for the first, or lower, page and those that go into the "1" state. When the next page is programmed in, the erase state is split into two states, one of which is still the erased level, while the other is programmed, but to a value less the programmed value of the "1" state for the first page; the "1" level of the first page is then programmed also split into two levels by the programming of the second page. The process continues in this way as each additional page is programmed in. This sort of bifurcation of states is shown in FIG. 3: after programming in page i there will be a distribution of threshold voltages for a given state such as is shown at 301. When the next page, page i+1, is programmed in, this intermediate level will be split into distributions 311 and 313. The amount of movement in threshold levels in the programming of each page will progressively decrease with.

Figure 4:
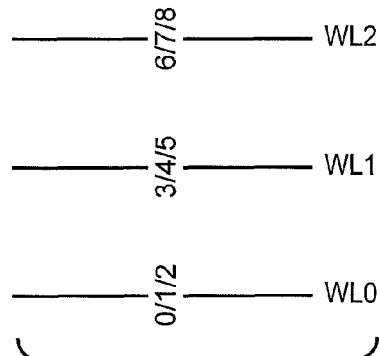
FIG. 4 shows a basic assignment of pages to wordlines for 3 bit cells.

FIG. 4 shows a basic assignment of pages to wordlines for 3 bit cells, where pages are just assigned to wordlines as they come in; that is, where there is no wordline order. Thus, pages 0-2 (0/1/2) will be successively written into wordline 0, pages 3-5 (3/4/5) successively written into WL1, and so on (6/7/8). In this page assignment, the WL to WL coupling is 100% and a look ahead read will be needed for correction. Labeling the states above the erased or ground state as A-G and reading in pages starting with the lowest page, the LA read steps are as following:
1) Read 7 states on WLn+1 and save 3 bits of information on 3 data latches;
2) Use one data latch to correct the WLn data on a page by page basis;
3) The first read process for the lower page uses just need one read—read at D. The readD will be done in 8 reads, a) read D without correction, b) read D with A correction, c) read D with B correction, d) read D with C correction, e) readD with D correction, f) readD with E correction, g) readD with F correction, h) readD with G correction.
4) The second read process for the second page needs to 2 reads—readB and readF. Each read will do 8 read for Look Ahead correction.
5) The third page read uses 5 reads—readA, readC, readE and readG where each needs 8 read for Look Ahead Correction.

This results in a total of 64 reads. Reading the states in the E, A, B, ... order gives a similar result as state needs one uncorrected read and eight corrections. Consequently, although all 3 pages on the same WL can be programmed together, which can improve the program performance, the number of reads needed when the full look ahead process used is large and the resultant read time is long.

Figure 5:
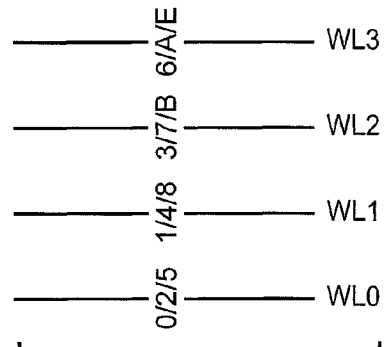
FIG. 5 illustrates a full 3 page per wordline lower middle coding.

If the wordlines are programmed using the full LM code for 3 bits per cell, the WL-WL Yupin effect will be corrected by the page order. FIG. 5 shows the page assignment for the 3 page per wordline case in the LM code (0/2/5 on WL0, 1/4/8 on WL1, 3/7/B on WL2, 6/A/E on WL3, ...). In FIG. 5, A, B, E are page numbers 10, 11, 14 in hexadecimal notation, rather than the state. As shown, one page at a time is recorded on a wordline in the order shown, which continues the pattern for the additional wordlines for the rest of the data set. The BL-BL capacitive coupling will be determined by the LM code used. The WL-WL Yupin effect can be analyzed as in the diagram of FIG. 6.

Figure 6:
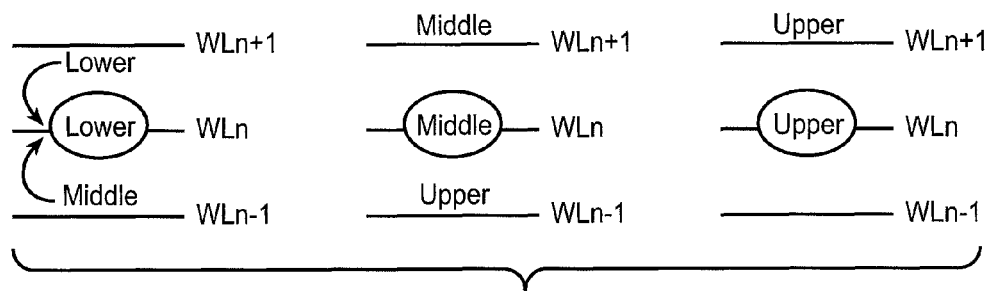
FIG. 6 shows an analysis of WL-WL capacitive coupling for the wordline order of FIG. 5.

Considering the effects of pages WLn−1 and WLn+1 on page WLn, as shown on the left of FIG. 6, the lower page will be coupled by the next WL lower page and previous wordline middle page. As shown in the middle of FIG. 6, the middle page will be coupled by the next WL's Middle page and previous WL's Upper page. The Upper page will be couple by the next WL's upper page, as shown on the right. The resultant coupling rations are given in the following table.

|  | WL Coupling Ratio |
| --- | --- |
| Lower page | 0.5 + 0.4 = 0.9 |
| Middle page | 0.4 + 0.25 = 0.65 |
| Upper page | 0.25 |

The table shows that the lower page will experience of 90% of the total WL WL coupling; for example, if the total WL WL coupling is shift 1V to higher voltage, then 90% of the total WL WL coupling will be shifting 0.9V towards higher voltage after the worst WL WL coupling. Similarly, the middle page will experience 65% of the total WL WL coupling and the upper page, which is programmed the last on a given wordline, will experience the least amount of WL WL coupling of 25% of total amount. In this WL order, any page has to be programmed separately from the other pages on the same wordline, which will slow down the program performance.

In one preferred embodiment, more than one, but less than all, of the pages that a wordline can hold are programmed together in a full sequence write. For the 3 bit per page (or three page per word line) case, this page assignment will program the lower and middle pages together on the same WL, while the upper page will jump with WL orders. This is shown in FIG. 7.

Beginning at the first wordline to be written, here WL0, pages 0 and 1 are written together in a full sequence write (that is, pages 0/1 are written at the same time, not consecutively) as the lower and middle, after which pages 2 and 3 (2/3) are written at the same time on WL1. The process then goes back to write the upper page (page 4) on WL0. The rest of the pages are then written according to the pattern of jumping forward two WLs and writing the lower and middle page, then drop back and write the upper page, as shown in FIG. 7 (5/6, 7, 8/9, a, b/c, d, ...). (Here again, a, b, c, ..., are hexadecimal numbering of page numbers.)

Figure 7:
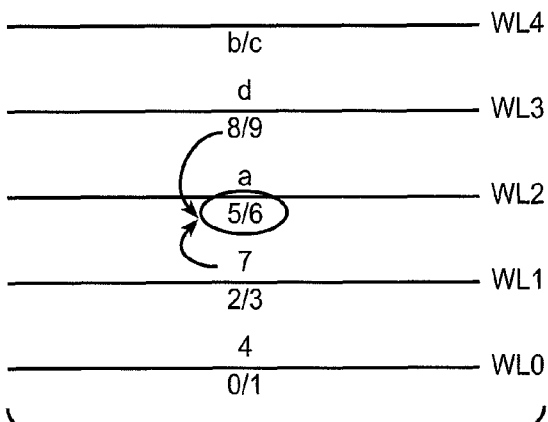
FIG. 7 illustrates a 3 bit example of an order for programming data pages onto wordlines where more than one, but less than all, of the pages are programmed concurrently in a full sequence process.

The arrangement of FIG. 7 has several advantages relative to the lower-middle order of FIG. 5. A first of these is a reduction in the WL-WL capacitive coupling (Yupin effect) due to the LM-type programming. Another is that the cache program process, described in more detail in the references cited above, will be faster where the lower page and middle page can be programmed together. Further, the assignment of page number to wordlines, which can become quite complicated for a full LM arrangement as the number of bits increases, will be easier. Further, this arrangement will eliminate the WLn+2 back pattern problem in program disturb, where the WLn+2 programmed cells will reduce the efficiency of channel boosting for program inhibit.

Figure 8:
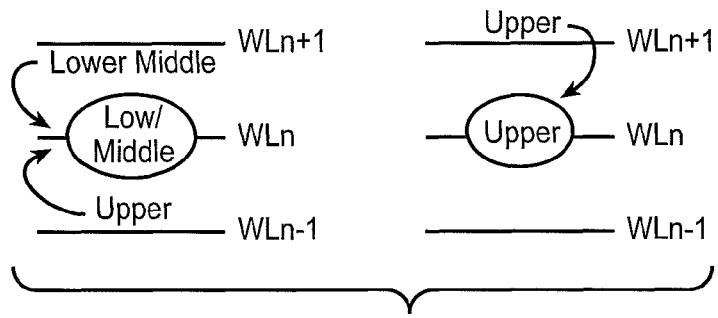
FIG. 8 shows an analysis of WL-WL capacitive coupling for the wordline order of FIG. 7.

FIG. 8 is used to illustrate the WL-WL capacitive coupling when the page assign and program order shown. As shown on the left side, the combined lower/middle page on WLn will couple to the lower/middle page of the next wordline (WLn+1) and the upper page preceding wordline (WLn−1), which is same with full WL LM shown in the middle of FIG. 6. A LA read can then be used to read back the middle page during the upper page program. The middle page LA correction can consider the WLn+1 middle page effect, since this is largest such effect in this order. In this case, the WL-WL coupling effect can be estimated as following:

| Coupling Ratio | WL-WL |
| --- | --- |
| Lower page | 0 |
| Middle page | 0.75 + 0.25 = 1 |
| Upper page | 0.25 |

With respect to the incorporation of the look ahead read, the number of data latches required varies based upon the amount of correction needed. A particular method for dealing with these, which can be incorporated in the techniques presented here, is given in the U.S. patent application Ser. No. 12/051,462, entitled "Adaptive Algorithm in Cache Operation with Dynamic Data Latch Requirements", by Yan Li and Anne Pao-Ling Koh, filed Mar. 19, 2008.

The upper page only WL LM mode is generally preferred over the "no order" mode (FIG. 4) and full LM mode (FIG. 5) for the following advantages:
1) Lower and middle pages can be programmed concurrently, with a resultant savings in write time.
2) Lower and middle pages can be loaded during upper page programming to save on data loading time.

3) The reading of the middle pages for the upper page program can use the LA read scheme to make middle page program faster as a larger step size in the program voltage can be used. Since the LA read is only executed once inside the write operation, the time penalty is not as great as the LA read applied to the "no order" assignment of FIG. 4.

4) The LA reading that needs to be performed in the normal read (i.e., non-verify) process is only for correcting the upper page to upper page WL-WL Yupin coupling. This correction is only 1 bit correction:
   a) read WLn+1 (or obtain the WLn+1 information) and compress to 1 bit information, either correct or no correction;
   b) Correct each WLn state with no correction read and correction read.

It should also be noted that as the upper page is programmed in a LM process, the amount of movement in cell population distributions will be relatively small, as illustrated with respect to FIG. 3, and the corresponding differential in the Yupin effect (and required correction) when the upper page is written will also be relatively small. Because of this, in some cases it can be decided to actually skip the upper page look ahead corrections. As is common with such things, this is again a compromise between accuracy and speed and will be a design choice to be made in a given application.

Figure 9:
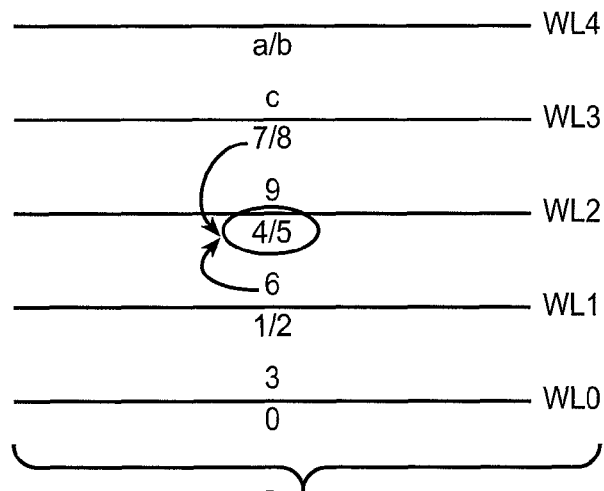
FIG. 9 shows a variation of FIG. 7 to account for the first wordline of an array.

The pattern described with respect to FIG. 7 may need to be adjusted at the boundary of a block, where the first or last wordline may need to be treated different to the block boundary. (In the discussion so far, although a wordline may have been labeled WL0, the 0 referred tot the first wordline programmed in the data set, not the first wordline of a block, although they may coincide as in the discussion here.) To take the boundary into effect, there may only be (in the 3 bit example) 2 bits written onto the first and last wordline. A different page numbering arrangement may be developed to reflect the principle of only jumping the last page of the wordline. FIG. 9 shows an example (0, 1/2, 3, 4/5, 6, 7/8, 9, 1/b, c, . . . ) where the WL0 is the first wordline of the block and has only the pages 0 and 3 and the Yupin effect will only be from page 6 on WL1. (FIG. 9 can be compared to FIG. 7 where WL0 is the first used to hold the data set, but not the first of a block.)

When there is the ability to store 4 or more bits per page, there exists more than one way to bundle pages together to be able to program more than one, but less than all, of the pages concurrently. Taking the 4 bits per cell example, if the lowest two pages are written concurrently, while the uppermost page is written in a LM mode, this still leave multiple options for the next to uppermost page. The preferred embodiments will follow the principle of minimizing LA read corrections and use of WL order to correct.

Figure 10:
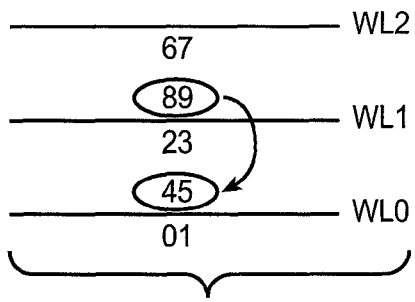
FIGS. 10 and 11 illustrate a pair of 3 bit examples of an order for programming data pages onto wordlines where more than one, but less than all, of the pages are programmed concurrently in a full sequence process.

FIG. 10 shows a first arrangement for 4 bits per cell, where the lower two (01, 23, 67 . . . ) pages are programmed concurrently, and the upper pages (45, 89, . . . ) are programmed currently, with a LM mode for these pairs of pairs. The LA read can correct the upper 2 pages, which will be 2 bits correction, for a total of 16 reads.

Figure 11:
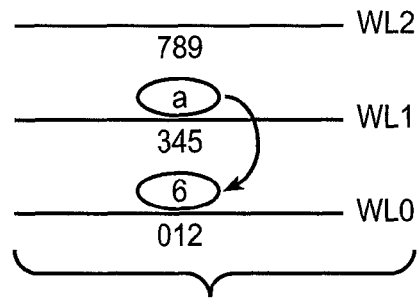

FIG. 11 shows a second arrangement, where the lowest three pages (012, 345, 789, . . . ) are bundled together, and then the uppermost page (6 a, . . . ) only uses the LM arrangement. If the 3 lower pages are programmed together, then the left over, uncorrected WL-WL Yupin coupling is only for the most upper page coupling. If the LA read is corrected, it will only need 1 bit LA correction, which may be a good compromise between program speed versus read speed.

Figure 12:
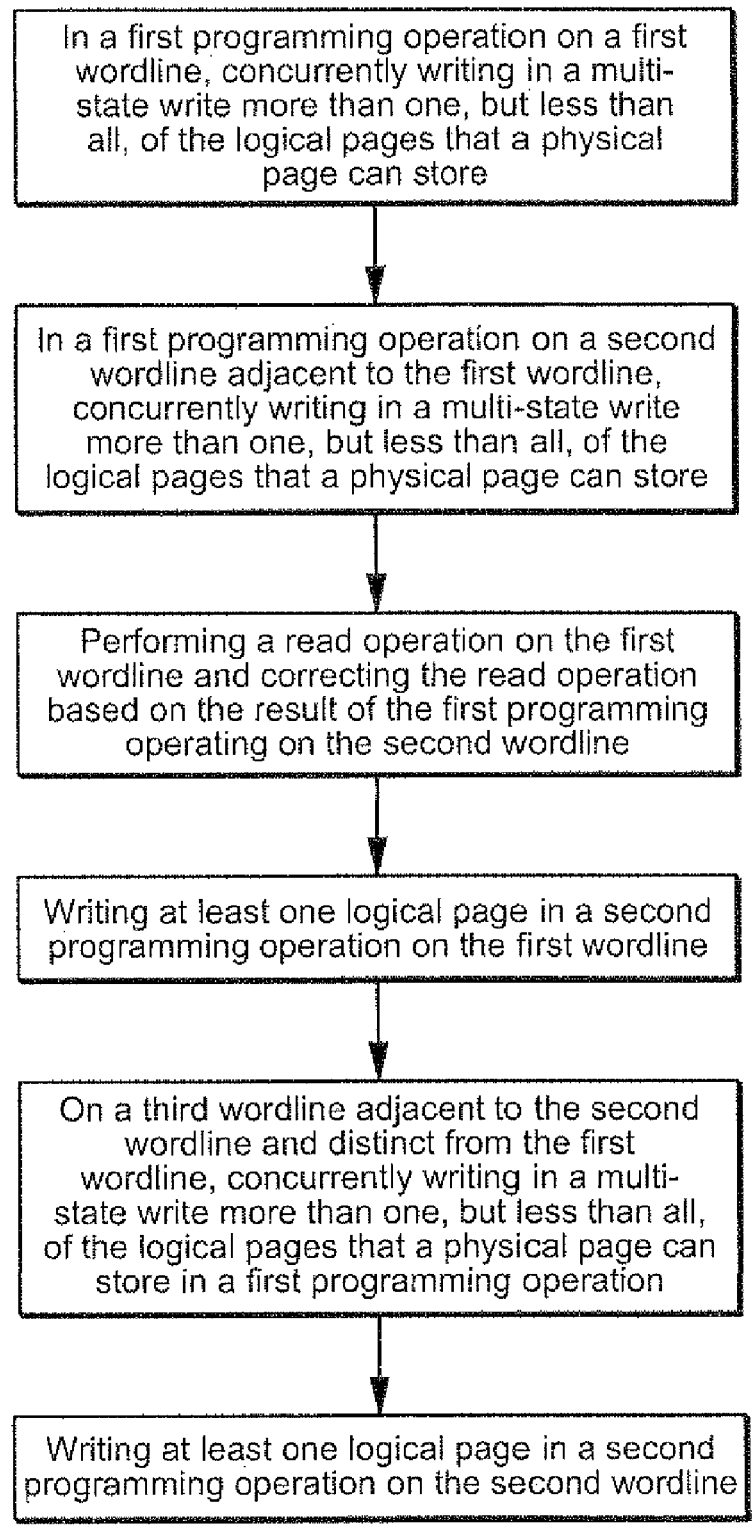
FIG. 12 is a flow chart for a general embodiment.

FIG. 12 is a flow chart for one embodiment of a method of operating a non-volatile memory device having an array of memory cells formed along wordlines and read and write circuits for operating on addressable pages of memory cells on a given wordline in parallel, wherein each memory cell is capable of storing three or more bits and the write circuitry can store a corresponding number of logical pages on a given physical page along a wordline. The method includes concurrently writing in a multi-state write more than one, but less than all, of the logical pages that a physical page can store in a first programming operation on a first wordline. Subsequently more than one, but less than all, of the logical pages that a physical page can store are concurrently written in a multi-state write in a first programming operation on a second wordline adjacent to the first wordline. Subsequent to the first programming operation on the first wordline, the method can include performing a read operation on the first wordline and correcting the read operation based on the result of the first programming operating on the second wordline. Subsequently at least one logical page is written in a second programming operation on the first wordline. In a subsequent first programming operation on a third wordline adjacent to the second wordline and distinct from the first wordline, more than one, but less than all, of the logical pages that a physical page can store can be concurrently written in a multi-state write. The method can subsequently write at least one logical page in a second programming operation on the second wordline.

In some four bits per cell memory embodiments, a binary cache block is used to save the incoming user data, which is then programmed in 4 bits per cell block later. (A similar arrangement can be used for 3 bit per cell embodiments.) The dedicated block is typically only programmed in binary or, maybe, 2 bits per cell fashion. If the data is temporarily saved in the cache block, then the first programming pass does not need to be programmed using a very fine step size. It can be programmed roughly, even with overlapping distributions. During the final distribution program, the data can be read in from the binary cache block and programmed again. Thus, if all the data is stored in binary buffer blocks, then the lower 3 pages do not be read in from the 4 bit per cell arrays and the full four bits can be programmed in a first round of programming into a wordline WLn. The WL n+1 data can also be read with great accuracy from the binary blocks. That is, the page numbers to program are formulated first and the algorithm can program some page numbers later after next wordline is programmed and read with a look ahead read. In the case of a full 4 bit programming using the binary cache, something similar can be done, but with the concept extended to program all 4 bits in a first pass and come back using a look ahead read to do the second pass.

Consequently, as seen by the exemplary embodiments, the page arrangement suggested here memories that can store 3 or more bits per cell, namely programming more than one of lowest lowermost pages concurrently while treating at least the uppermost page in a lower middle-type coding, allows for a reduction in the look ahead read penalty. Since only higher level pages from the next wordline need to be corrected for, this full sequence write of the lower pages reduce the need for such corrections.

When data is written in pages, after the first write on a wordline, an internal data load is used for the subsequent writes. As seen in the examples above, the techniques suggested here for an internal data load utilizing a look ahead read to speed up the program speed with minimum performance penalty, since the middle pages are only read in a look ahead read in the upper page program sequence. The normal read will use 1 bit upper page LA correction in most of the cases. The middle page read will use 2 bits correction only if the upper page is not programmed yet.

Although the various aspects of the present invention have been described with respect to certain embodiments, it is understood that the invention is entitled to protection within the full scope of the appended claims.

What is claimed is:

1. A method of operating a non-volatile memory device having an array of memory cells formed along wordlines and read and write circuits for operating on addressable pages of memory cells on a given wordline in parallel, wherein each memory cell is capable of storing three or more bits and the write circuitry can store a corresponding number of logical pages on a given physical page along a wordline, the method comprising:

concurrently writing in a multi-state write more than one, but less than all, of the logical pages that a physical page can store in a first programming operation on a first wordline;

subsequently concurrently writing in a multi-state write more than one, but less than all, of the logical pages that a physical page can store in a first programming operation on a second wordline adjacent to the first wordline; and subsequently writing at least one logical page in a second programming operation on the first wordline.

2. The method of claim 1, further comprising:

subsequently concurrently writing in a multi-state write more than one, but less than all, of the logical pages that a physical page can store in a first programming operation on a third wordline adjacent to the second wordline and distinct from the first wordline.

3. The method of claim 1, further comprising:

subsequently writing at least one logical page in a second programming operation on the second wordline.

4. The method of claim 1, wherein each memory cell is capable of storing 3 bits and the write circuitry can store 3 logical pages on a given physical page along a wordline, and said first programming operations write 2 pages concurrently.

5. The method of claim 1, wherein each memory cell is capable of storing 4 bits and the write circuitry can store 4 logical pages on a given physical page along a wordline, and said first programming operations write 2 pages concurrently and the second programming operation writes 2 pages concurrently.

6. The method of claim 1, wherein each memory cell is capable of storing 4 bits and the write circuitry can store 4 logical pages on a given physical page along a wordline, and said first programming operations write 3 pages concurrently and the second programming operation writes 1 page.

7. The method of claim 1, further comprising:

subsequent to the first programming operation on the first wordline but prior to the second programming operation on the first wordline, performing a read operation on the first wordline and correcting the read operation based on the result of the first programming operating on the second wordline.

8. A non-volatile memory device, comprising:

an array of memory cells formed along wordlines; and read and write circuitry connectable to operate on addressable pages of memory cells on a given wordline in parallel, wherein each memory cell is capable of storing three or more bits and the write circuitry can store a corresponding number of logical pages on a given physical page along a wordline, and wherein the memory can concurrently write in a multi-state write operation more than one, but less than all, of the logical pages that a physical page can store in a first programming operation on a first wordline; subsequently concurrently write in a multi-state write more than one, but less than all, of the logical pages that a physical page can store in a first programming operation on a second wordline adjacent to the first wordline; and subsequently write at least one logical pages in a second programming operation on the first wordline.

9. The non-volatile memory of claim 8, where the memory can further subsequently concurrently write in a multi-state write more than one, but less than all, of the logical pages that a physical page can store in a first programming operation on a third wordline adjacent to the second wordline and distinct from the first wordline.

10. The non-volatile memory of claim 8, where the memory can further subsequently write at least one logical page in a second programming operation on the second wordline.

11. The non-volatile memory of claim 8, wherein each memory cell is capable of storing 3 bits and the write circuitry can store 3 logical pages on a given physical page along a wordline, and said first programming operations write 2 pages concurrently.

12. The non-volatile memory of claim 8, wherein each memory cell is capable of storing 4 bits and the write circuitry can store 4 logical pages on a given physical page along a wordline, and said first programming operations write 2 pages concurrently and the second programming operation writes 2 pages concurrently.

13. The non-volatile memory of claim 8, wherein each memory cell is capable of storing 4 bits and the write circuitry can store 4 logical pages on a given physical page along a wordline, and said first programming operations write 3 pages concurrently; and the second programming operation writes 1 page.

14. The non-volatile memory of claim 8, where, subsequent to the first programming operation on the first wordline but prior to the second programming operation on the first wordline, the memory can perform a read operation on the first wordline and correcting the read operation based on the result of the first programming operating on the second wordline.

* * * * *